(12) United States Patent
Ishida et al.

(10) Patent No.: US 8,720,531 B2
(45) Date of Patent: May 13, 2014

(54) ELECTRONIC DEVICE COOLING APPARATUS

(75) Inventors: Tomotaka Ishida, Tokyo (JP); Mitsuru Yamamoto, Tokyo (JP); Sakae Kitajo, Tokyo (JP); Kazuo Taga, Oyama (JP); Kazuhiro Kumakura, Oyama (JP)

(73) Assignees: NEC Corporation, Tokyo (JP); Showa Denko K.K., Tokyo (JP)

( * ) Notice: Subject to any disclaimer, the term of this patent is extended or adjusted under 35 U.S.C. 154(b) by 1320 days.

(21) Appl. No.: 12/162,716

(22) PCT Filed: Jan. 26, 2007

(86) PCT No.: PCT/JP2007/051746
§ 371 (c)(1),
(2), (4) Date: Jul. 30, 2008

(87) PCT Pub. No.: WO2007/086604
PCT Pub. Date: Aug. 2, 2007

(65) Prior Publication Data
US 2009/0050301 A1    Feb. 26, 2009

(30) Foreign Application Priority Data

Jan. 30, 2006 (JP) ................................. 2006-020553

(51) Int. Cl.
*F28D 15/00* (2006.01)
*H05K 7/20* (2006.01)
(52) U.S. Cl.
USPC ...................................... 165/104.33; 361/699
(58) Field of Classification Search
USPC ...................... 165/104.33; 361/699
See application file for complete search history.

(56) References Cited

U.S. PATENT DOCUMENTS

| 3,833,013 | A  * | 9/1974 | Leonard .................... 137/171 |
| 6,755,626 | B2 * | 6/2004 | Komatsu et al. .......... 417/413.2 |
| 7,483,261 | B2 * | 1/2009 | Mikubo et al. ................ 361/669 |
| 7,826,225 | B2 * | 11/2010 | Katada et al. ................. 361/699 |
| 8,081,460 | B2 * | 12/2011 | Ishida et al. .................. 361/700 |
| 2005/0069432 | A1 | 3/2005 | Tomioka |
| 2006/0037739 | A1 * | 2/2006 | Utsunomiya ............ 165/104.33 |

FOREIGN PATENT DOCUMENTS

| JP | 2004-47922 A | 2/2003 |
| JP | 2003-78271 A | 3/2003 |
| JP | 2003-304086 A | 10/2003 |
| JP | 2005-4743 A | 1/2005 |
| JP | 2005-26498 A | 1/2005 |
| JP | 2005-103440 A | 4/2005 |
| JP | 2005-166030 A | 6/2005 |

(Continued)

OTHER PUBLICATIONS

Office Action issued May 9, 2012, by the Intellectual Property Office of Japan in counterpart Japanese Application No. 2007-556053.

*Primary Examiner* — Brandon M Rosati
(74) *Attorney, Agent, or Firm* — Sughrue Mion, PLLC

(57) ABSTRACT

An electronic device cooling apparatus including a cooling device including a heat conductive plate formed with a flow path, a circulating pump, a liquid storage tank upper chamber and lower chamber provided on the upper and lower side of the heat conductive plate, and a bypass provided with the heat conductive plate so as to allow the cooling medium to pass through the liquid storage tank upper chamber and the liquid storage tank lower chamber.

2 Claims, 7 Drawing Sheets

(a)

(b)

(56) References Cited

FOREIGN PATENT DOCUMENTS

| | | |
|---|---|---|
| JP | 2005-167224 A | 6/2005 |
| JP | 2005-285947 A | 10/2005 |
| WO | 2005-001674 A1 | 1/2005 |
| WO | 2005/002307 A1 | 1/2005 |

* cited by examiner (a)

(b)

ELECTRONIC DEVICE COOLING APPARATUS

TECHNICAL FIELD

This invention relates to an electronic device cooling apparatus and, in particular, relates to an electronic device cooling apparatus suitable for cooling a heat generating component mounted in a notebook personal computer or the like.

BACKGROUND ART

In electronic devices such as personal computers in recent years, following the increase in operation processing amount and speed, there are mounted heat generating components that generate heat by themselves with high power consumption. As a typical example of the heat generating components, there is a CPU as an electronic component mounted in an electronic device. The amounts of heat generated from those many electronic devices have gone on increasing. Normally, various electronic components used in the electronic devices are limited in their use temperature range in terms of their heat-resistance reliability or the temperature dependence of their operating characteristics.

Therefore, with respect to these electronic devices, it is of urgent necessity to establish a technique for efficiently discharging to the outside the heat generated by the heat generating components inside the electronic devices.

Generally, in an electronic device such as a personal computer, a metal heat sink, a heat pipe, or the like as a heat absorbing component is attached to a heat generating component to carry out thermal diffusion to the entire electronic device by heat conduction.

Further, in an electronic device, an electromagnetic cooling fan is attached to a housing of the electronic device to dissipate heat from the inside to the outside of the electronic device.

However, for example, in an electronic device such as a notebook personal computer in which electronic components are mounted at high density, a heat dissipation space is small inside the electronic device.

Therefore, with the conventional cooling system using a cooling fan alone or the combination of a cooling fan and a heat pipe, there has been a cooling effect adaptable to a CPU with a power consumption up to about 30 W, but it has been difficult to sufficiently dissipate heat inside a CPU with a higher power consumption.

Even if the heat dissipation is enabled, it is essential to dispose a cooling fan with high blast performance and, in the case of such an electromagnetic cooling fan, sound calmness has been largely marred due to noise such as wind-cutting sounds of rotating blades thereof.

Further, also with respect to personal computers for use as servers, there has been an increasing demand for miniaturization and more sound calmness following the increase in diffusion rate thereof and thus there has arisen a problem of heat dissipation similar to that in notebook personal computers.

In view of this, for efficiently dissipating increased heat to the outside, there has been studied a cooling apparatus of the liquid-cooling type in which a cooling medium is circulated.

For example, Japanese Unexamined Patent Application Publication (JP-A) No. 2003-67087 as conventional art 1 discloses a portable information processing device liquid-cooling system in which, at the bottom of a personal computer body portion having a heat receiving head for receiving heat generated from a heat generating component in the personal computer body portion, there is disposed a liquid-cooling portion housing provided with a connecting head to which the heat from the heat generating component is transferred through the heat receiving head, a tube connected to the connecting head and filled with a cooling medium, and a pump for circulating the cooling medium.

Japanese Unexamined Patent Application Publication (JP-A) No. 2004-84958 as conventional art 2 discloses an electronic device, a liquid-cooling system, and a liquid-cooling tank, having a liquid-cooling structure for circulating a cooling liquid to thereby cool a high-heat component with the cooling liquid and further having a gas incorporation preventing structure for preventing the incorporation of air into a power source.

In the electronic device, the liquid-cooling system, and the liquid-cooling tank, a first heat dissipation pipe is a heat dissipation pipe on the inflow end side where the cooling liquid flows into the cooling tank and a second heat dissipation pipe is a heat dissipation pipe on the outflow end side where the cooling liquid flows out of the cooling tank. The cooling liquid flows into the tank from the first heat dissipation pipe and flows out into the second heat dissipation pipe.

Japanese Unexamined Patent Application Publication (JP-A) No. 2005-4743 as conventional art 3 discloses an electronic device apparatus that can allow only cooling water to flow out without discharging air.

In this electronic device apparatus, a pipe on the side where cooling water flows out of a tank is disposed so as to extend to the central position of the tank and, further, two plates are provided in the tank so as to partition the neighborhood of a pipe inlet portion where the cooling water flows out. A cooling water injection jig having a tank joint portion is used for injecting the cooling water into the tank.

Japanese Unexamined Patent Application Publication (JP-A) No. 2005-166030 as conventional art 4 discloses a heat receiving unit in which a heat receiver having a cooling fluid path in a substrate composed of two aluminum high heat conductive plates, an expansion tank apparatus having a cooling fluid path, and a cooling fluid circulation path connecting both cooling fluid paths together are integrally provided and a cooling liquid is sealed in both cooling fluid paths and the cooling fluid circulation path, a method of manufacturing the receiving unit, and a heat dissipation apparatus.

In this liquid-cooling type heat dissipation apparatus, the expansion tank apparatus is provided with a tank placing base and an expansion tank provided on the tank placing base. The expansion tank comprises a tank body having a bulged portion and a bottom plate closing a lower end opening of the tank body and extending rearward further than the tank body. A baffle plate extending upward and inclined radially inward is integrally formed around the entire periphery of a through hole of the bottom plate so that an opening is formed surrounded by a tip end of the baffle plate.

The amount of the cooling liquid is set so that when the substrate is placed upside down, the cooling liquid fills the inside of the cooling fluid paths and the inside of the cooling fluid circulation path and further the liquid level of the cooling liquid in the bulged portion of the expansion tank is located above the opening at the tip end of the baffle plate at the bottom plate of the expansion tank.

Further, International Publication No. WO2005/002307 as conventional art 5 proposes a liquid-cooling apparatus completely sealed with a metal, which aims at minimizing liquid permeation in order to achieve a reduction in size and thickness.

This liquid-cooling apparatus is basically configured such that a plurality of metal plates formed with flow paths or the like in advance are joined together and is further configured such that a pump and a liquid storage tank are also integrally formed.

With the liquid-cooling type cooling system disclosed in Japanese Unexamined Patent Application Publication (JP-A) No. 2003-67087, there is a problem that the tube and so on are made of a resin material and thus the volume of a liquid storage tank for reserving in advance an amount corresponding to liquid permeation through the resin material increases, thus resulting in an increase in size of the entire system.

With the electronic device, the liquid-cooling system, and the liquid-cooling tank disclosed in Japanese Unexamined Patent Application Publication (JP-A) No. 2004-84958, there is a problem that since the flow paths are formed by the pipes, impact is given to the height of the device and thus a reduction in thickness cannot be achieved.

With the electronic device apparatus disclosed in Japanese Unexamined Patent Application Publication (JP-A) No. 2005-4743, there is a problem that since the two plates are provided in the tank so as to partition the neighborhood of the pipe inlet portion where the cooling water flows out and the cooling water injection jig having the tank joint portion is used for injecting the cooling water into the tank, impact is given to the height of the apparatus and thus a reduction in thickness cannot be achieved.

With the heat dissipation apparatus disclosed in Japanese Unexamined Patent Application Publication (JP-A) No. 2005-166030, there is a problem that since an upper-side storage space and a lower-side storage space are provided so as to sandwich an outflow end therebetween, the water storage tank can be provided only on the upper side with respect to the high heat conductive plate, so that height impact is given to the cooling system and thus a reduction in thickness cannot be achieved.

Further, with the heat dissipation apparatus disclosed in Japanese Unexamined Patent Application Publication (JP-A) No. 2005-166030, there is a problem that since the position of the opening formed by the baffle plate should be located at the center of the height of the tank or higher, the structure is largely restricted in height or the like.

Further, with the cooling apparatus disclosed in International Publication No. WO2005/002307, there is a problem that air is reserved in the liquid storage tank in advance for suppressing an increase in internal pressure due to a rise in temperature or an increase in internal pressure of the cooling apparatus due to generation of gas by corrosion reactions between a cooling liquid and a metal, but if the air enters the flow path during operation of the liquid-cooling apparatus, the cooling performance is lowered.

It is therefore an object of this invention to provide an electronic device cooling apparatus that can be mounted in a space.

It is another object of this invention to provide a liquid-cooling apparatus that can reduce height impact to an electronic device.

Further, it is another object of this invention to provide an electronic device cooling apparatus that can prevent a reduction in cooling performance and improve the reliability.

DISCLOSURE OF THE INVENTION

According to this invention, there is obtained an electronic device cooling apparatus that diffuses heat generated from a heat generating component by circulation of a cooling medium to carry out cooling, the electronic device cooling apparatus characterized by comprising cooling means formed with a groove serving as a flow path for the circulation of the cooling medium, a circulating pump for circulating the cooling medium, and a liquid storage tank provided with a branch hole that branches the flow path into an upper portion and a lower portion, and with a bypass provided between the upper portion and the lower portion with respect to the branch hole so as to allow the cooling medium to pass through an upper space and a lower space with respect to the branch hole.

Further, according to this invention, there is obtained an electronic device cooling apparatus characterized in that the cooling medium is filled to a position above an outlet of the branch hole and, further, a volume of a space not filled with the cooling medium is smaller than that of the lower space with respect to the branch hole.

Further, according to this invention, there is obtained an electronic device cooling apparatus characterized in that the bypass is provided in the number of at least one in each of two regions of the liquid storage tank divided by the flow path passing through the liquid storage tank.

Further, according to this invention, there is obtained an electronic device cooling apparatus characterized in that an area of the bypass is greater than that of the outlet of the branch hole.

Further, according to this invention, there is obtained an electronic device cooling apparatus characterized in that the sum total of areas of a plurality of bypasses is greater than an area of the outlet of the branch hole.

There is obtained an electronic device cooling apparatus characterized in that, on a bottom surface of the upper space with respect to the branch hole in the liquid storage tank, there is formed a tapered portion of a circular truncated cone shape having an outlet of the branch hole as a vertex.

Further, according to this invention, there is obtained an electronic device cooling apparatus characterized in that the cooling means has a heat conductive plate comprising a lower plate and an upper plate, the groove is formed by bulging at least one of the lower plate and the upper plate, a bulged flow path is formed on a side of the lower plate at a joining portion between an upper cover forming the upper space with respect to the branch hole and the upper plate, and a bulged flow path is formed on a side of the upper plate at a joining portion between a lower cover forming the lower space with respect to the branch hole and the lower plate.

Further, according to this invention, there is obtained an electronic device cooling apparatus characterized in that the groove is formed by bulging the lower plate and a lower cover forming the lower space with respect to the branch hole, communicating with the upper space with respect to the branch hole through the bypass, is formed at a portion except the flow path.

BEST MODE FOR CARRYING OUT THE INVENTION

In order to describe the invention in more detail, a description thereof will be given with reference to the accompanying drawings. In the case of an electronic device cooling apparatus of this invention, to briefly explain a technical outline thereof, it is an electronic device cooling apparatus that diffuses heat generated from a heat generating component by circulation of a cooling medium to carry out cooling, and is realized by comprising cooling means formed with a groove serving as a flow path for the circulation of the cooling medium, a circulating pump for circulating the cooling medium, and a liquid storage tank provided with a branch hole that branches the flow path into an upper portion, and with a bypass provided between the upper portion and a lower portion with respect to the branch hole so as to allow the cooling medium to pass through an upper space and a lower space with respect to the branch hole.

Figure 1:
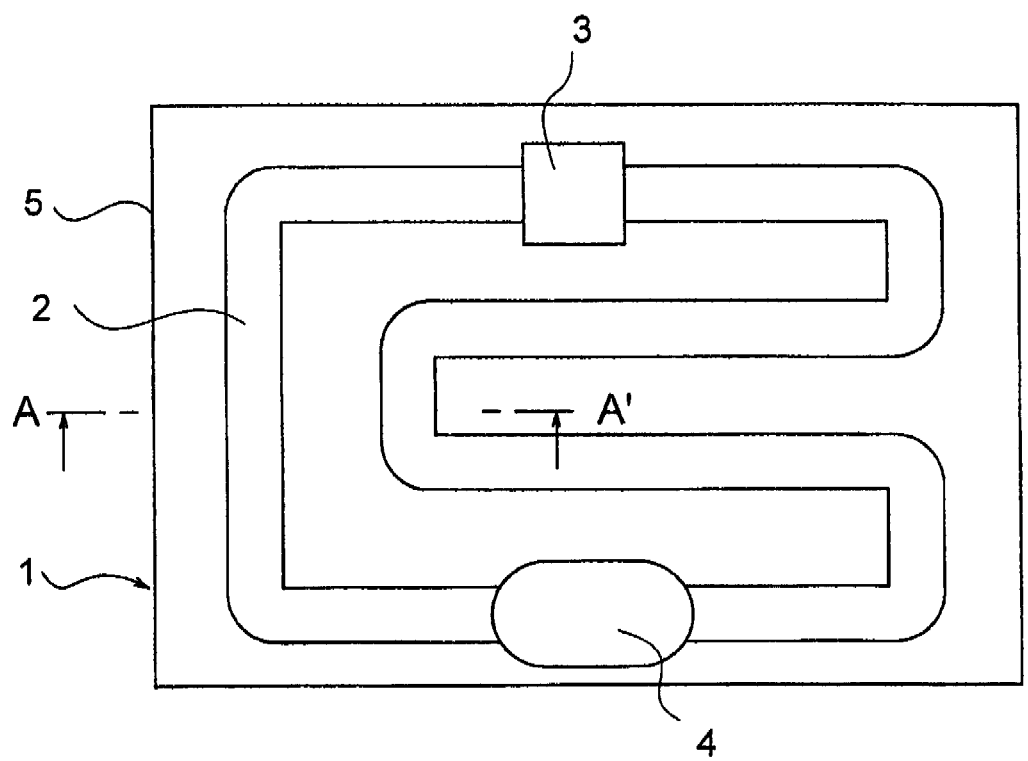
FIG. 1 shows the overall structure of an electronic device cooling apparatus according to an embodiment 1 of this invention, wherein (*a*) is a plan view and (*b*) is a sectional view, taken along line A-A', of the electronic device cooling apparatus shown in (*a*).
Figure 1:
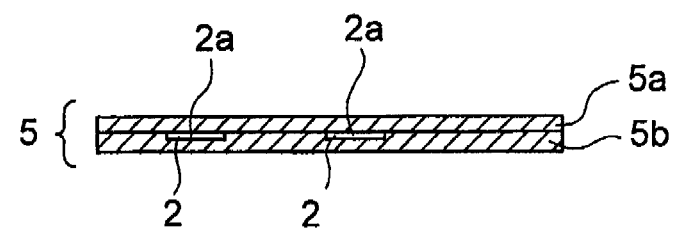

Hereinbelow, an electronic device cooling apparatus according to an embodiment 1 of this invention will be described in detail with reference to the drawings. FIG. 1(a) is a diagram seeing the whole of the electronic device cooling apparatus according to this invention in plan view. FIG. 1(b) shows a section, taken along line A-A', of the electronic device cooling apparatus shown in FIG. 1(a).

Referring to FIG. 1(a) and FIG. 1(b), a cooling apparatus 1 in the embodiment 1 can be suitably used as a cooling apparatus for an electronic component in an electronic device, for example.

The cooling apparatus 1 comprises a heat conductive plate 5 provided with a flow path 2, a circulating pump 3 connected to the heat conductive plate 5 for circulating a cooling liquid (medium) in the flow path 2, and a liquid storage tank 4 for reserving in advance the cooling liquid in an amount corresponding to expected liquid permeation and air for suppressing the internal pressure.

The heat conductive plate 5 having the flow path 2 and the circulating pump 3 cooperatively form the flow path 2 of a circulating closed path structure. The flow path 2 is filled with the cooling liquid (not shown) to be circulated. In the case where an object to be cooled such as an electronic device is brought into thermal contact with the heat conductive plate 5 at its arbitrary position, if the cooling liquid is circulated by the circulating pump 3, it is possible to efficiently diffuse heat of the object to be cooled.

The heat conductive plate 5 is composed of two flat plates in the form of an upper plate 5a and a lower plate 5b. The lower plate 5b is formed with a groove 2a of a predetermined pattern according to a route of the flow path 2. By placing the upper plate 5a and the lower plate 5b one over the other so that the upper plate 5a faces the groove 2a of the lower plate 5b, the flow path 2 is formed in the heat conductive plate 5. Herein, the upper plate 5a and the lower plate 5b of the heat conductive plate 5 and the groove 2a cooperatively form cooling means.

In the embodiment 1 shown in FIG. 1(b), the groove 2a is formed on the lower plate 5b in the predetermined pattern. However, a flow path 2 may be formed by forming a groove 2a on the upper plate 5a and placing the lower plate 5b thereover. Alternatively, a flow path 2 may be formed by forming a groove 2a on each of the lower plate 5b and the upper plate 5a in a predetermined pattern according to a route of the flow path 2 and placing the lower plate 5b and the upper plate 5a one over the other.

As the heat conductive plate 5, use is preferably made of a metal material such as aluminum or copper that is highly thermally conductive and excellent in workability, corrosion resistance, cost, and so on.

Figure 2:
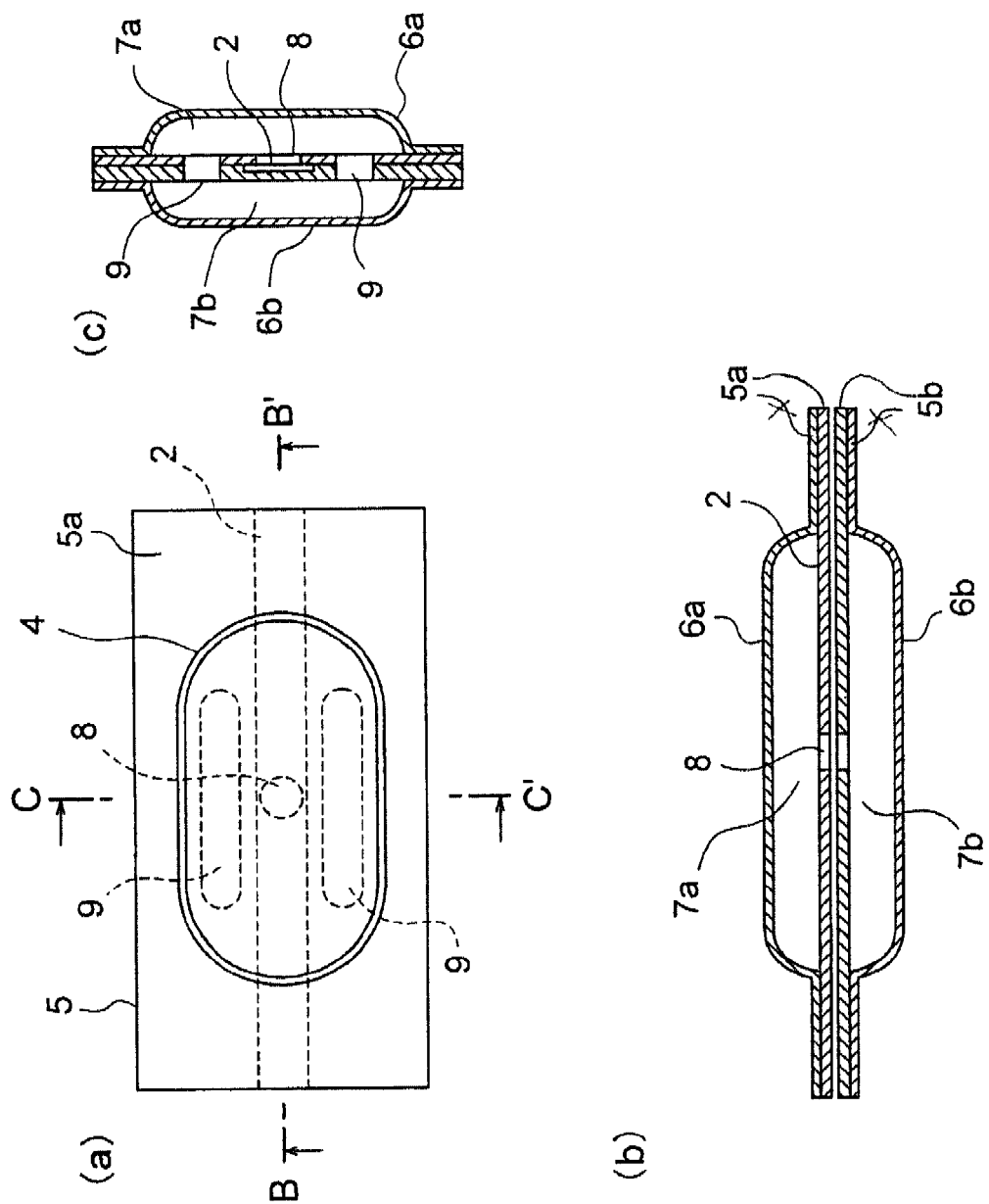
FIG. 2 enlargedly shows a liquid storage tank of the cooling apparatus shown in FIG. 1, wherein (*a*) is a top view of the liquid storage tank, (*b*) is a sectional view taken along line B-B' in (*a*), and (*c*) is a sectional view taken along line C-C' in (*a*).

FIG. 2(a) is a top view showing a detailed diagram of the liquid storage tank 4, FIG. 2(b) shows a section taken along line B-B' in FIG. 2(a), and FIG. 2(c) shows a section taken along line C-C' in FIG. 2(a).

The liquid storage tank 4 has a liquid storage tank upper cover 6a provided above the upper plate 5a and a liquid storage tank lower cover 6b provided below the lower plate 5b.

A liquid storage tank upper chamber (upper space) 7a formed by the liquid storage tank upper cover 6a and upper plate 5a is spatially connected to the flow path 2 by a branch hole 8 formed through the upper plate 5a in the liquid storage tank upper chamber 7a.

Further, a liquid storage tank lower chamber (lower space) 7b formed by the liquid storage tank lower cover 6b and the lower plate 5a is spatially connected to the liquid storage tank upper chamber 7a by a pair of bypasses 9. At least one bypass 9 is provided in each of two regions of the liquid storage tank 4 divided by the flow path 2 passing through the liquid storage tank 4.

As shown in FIG. 2(b) and FIG. 2(c), since the liquid storage tank 4 is open because of the provision of the branch hole 8 on the upper side of the flow path 2, air bubbles incorporated into the flow path 2 due to temperature changes or the like are collected into the liquid storage tank upper chamber 7a through an outlet of the branch hole 8.

The air stored in the liquid storage tank 4 serves to suppress an increase in pressure in the flow path 2 due to expansion and contraction of the liquid following temperature changes or an increase in pressure due to generation of gas by corrosion reactions or the like, thereby contributing to improvement in durability of the cooling apparatus 1. However, if the stored air enters the flow path 2 and flows into the circulating pump 3, there is a possibility that the discharge pressure of the circulating pump 3 is lowered and thus the performance of the circulating pump 3, i.e. the flow rate of the cooling liquid, is extremely reduced.

Therefore, in order to prevent the air, once stored, from returning to the flow path, it is necessary that the outlet of the branch hole 8 be always immersed in the cooling liquid.

Figure 3:
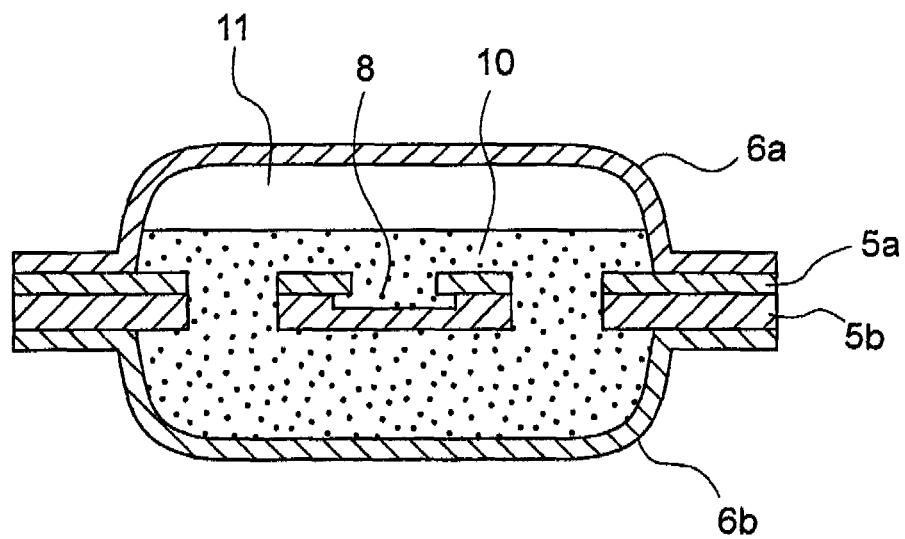
FIG. 3 is a sectional view enlargedly showing a state where the liquid storage tank shown in FIG. 2 is filled with a cooling liquid.

As shown in FIG. 3, a cooling liquid 10 is filled so as to exceed the branch hole 8 by an amount subjected to liquid permeation in a period of use. Further, the volume of the liquid storage tank lower chamber 7b is configured to be equal to or greater than that of air 11 reserved in advance.

Figure 4:
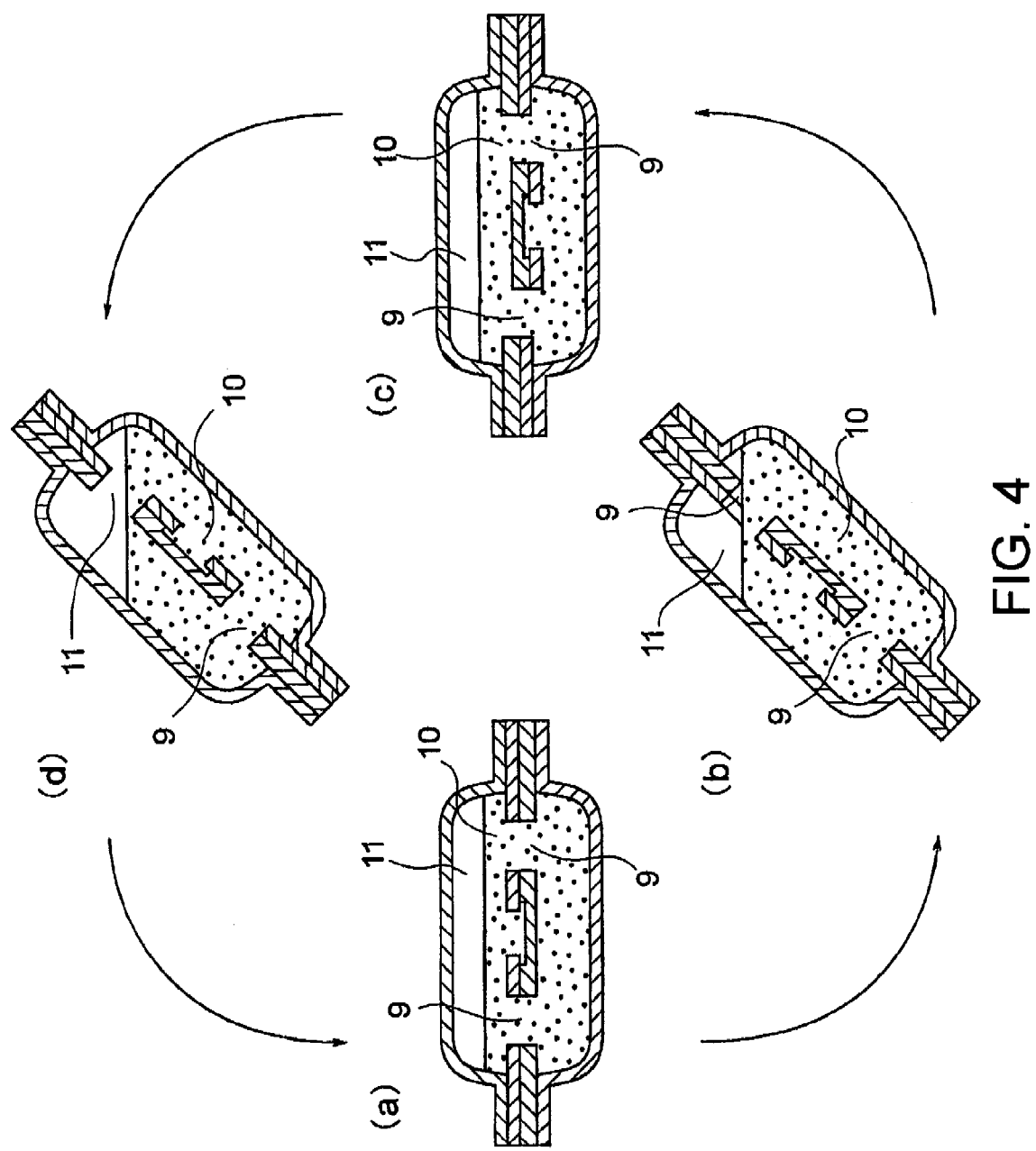
FIG. 4 shows states where the liquid storage tank shown in FIG. 2 is rotated, wherein (*a*) is a sectional view showing the normal position shown in FIG. 3, (b) is a sectional view showing an inclined position, (c) is a sectional view showing a position where the state of (a) is reversed, and (d) is a sectional view showing an inclined position.

In the liquid storage tank 4, as shown in FIG. 4(a), since the specific gravity of the air 11 is smaller than that of the cooling liquid 10, the air 11 stays above in a normal use state of the cooling apparatus 1. Then, in a state where the cooling apparatus 1 is inclined, as shown in FIG. 4(b), the cooling liquid 10 passes through the bypass 9 and enters the liquid storage tank lower chamber 7b. In the course of this, the air 11 in the liquid storage tank 4 stays so as to be biased in a certain direction. In this event, the outlet of the branch hole 8 does not come out of the liquid so that the air 11 in the liquid storage tank 4 does not enter the branch hole 8.

Then, when the cooling apparatus 1 is further inclined so as to be placed upside down, the liquid storage tank 4 is in a state shown in FIG. 4(c). Even in this state, the cooling liquid 10 is filled to a level above the branch hole 8 and, since the volume of the liquid storage tank lower chamber 7b is equal to or greater than that of the air 11, the outlet of the branch hole 8 is always immersed in the cooling liquid 10. In this state, the air 11 stays in the liquid storage tank 4 and does not enter the branch hole 8.

Then, when the cooling apparatus is further inclined, the liquid storage tank 4 is shifted from the state shown in FIG. 4(c) to a state shown in FIG. 4(d), where the air 11 in the liquid storage tank 4 passes through the bypass 9 and stays in the liquid storage tank upper chamber 7a.

A preferable condition for preventing the air 11 from entering the branch hole 8 in the sequence from FIG. 4(a) to FIG. 4(d) is that at least one bypass 9 is provided on each of the left and right sides with the flow path 2 taken as an axial direction. Attention should be paid to the fact that, in the case of a bypass on only one of the left and right sides, an allowable direction of rotation is limited.

A further preferable condition is that the size of each bypass 9 is set sufficiently larger than that of the branch hole 8. However, in the case where the size of the bypass 9 cannot be sufficiently obtained due to conditions such as in terms of strength, it may be considered to take a measure such as providing a partition plate/plates in the bypass 9 or reducing an area per bypass to thereby provide a plurality of bypasses. Further, it is preferable that the bypass 9 be located away from the branch hole 8.

Figure 5:
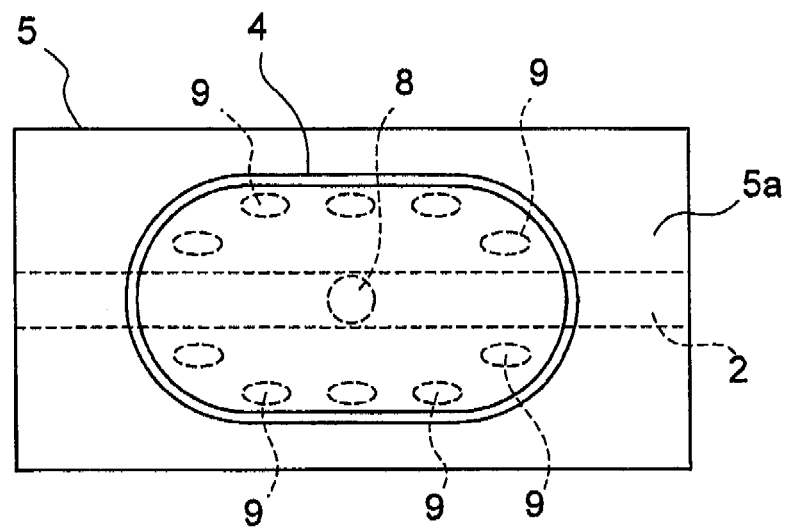
FIG. 5 is a plan view showing a layout of a plurality of bypasses in the liquid storage tank shown in FIG. 2.

It is preferable that the bypass 9 cover the peripheries of the liquid storage tank upper chamber 7a and the liquid storage tank lower chamber 7b. For example, it may be configured such that, as shown in FIG. 5, two or more bypasses 9 are arranged at peripheral portions of the liquid storage tank upper chamber 7a and the liquid storage tank lower chamber 7b.

Using the bypasses 9 as described above, it is possible to use the lower side of the heat conductive plate 5. Since it is possible to make large the amount of air that can be reserved in the liquid storage tank 4, the height of the liquid storage tank 4 can be reduced. Further, since the liquid storage tank 4 is divided into the upper and lower portions with respect to the heat conductive plate 5, it is possible to balance the entire cooling apparatus 1.

Further, if the cooling apparatus 1 is mounted so that the liquid storage tank lower chamber 7b is disposed in a place, where other components are not provided, on the lower side of the heat conductive plate 5, no impact is given to the height of an electronic device.

Figure 6:
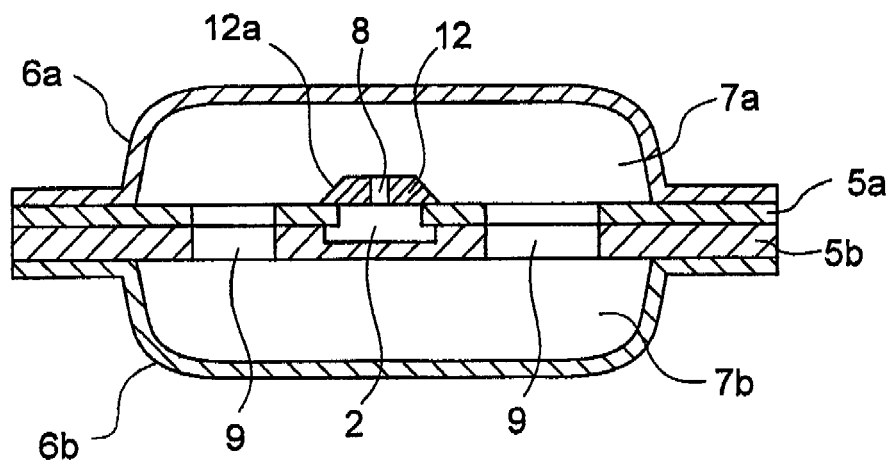
FIG. 6 is a sectional view showing a modification of the liquid storage tank of the embodiment 1 shown in FIG. 3.

FIG. 6 shows a modification of the cooling apparatus described according to the embodiment 1. The same portions as those of the cooling apparatus 1 shown by the embodiment 1 are assigned the same symbols, thereby omitting part of description.

Referring to FIG. 6, on a bottom surface of a liquid storage tank upper chamber 7a above a branch hole 8 in a liquid storage tank 4, there is formed a tapered portion 12 of a circular truncated cone shape having an outlet of the branch hole 8 as a vertex. The provision of the tapered portion 12 over the branch hole 8 can make it more difficult for air 11 (see FIG. 3) to return to the flow path 2. That is, with the tapered portion 12, the air 11 moves along a tapered surface 12a of the tapered portion 12 when the liquid storage tank 4 is rotated, and therefore, the air 11 tends to jump over the neighborhood of the outlet of the branch hole 8.

In the modification of the embodiment 1, since the air 11 stays in a liquid storage tank lower chamber 7b through a bypass 9, it is not necessary to provide the tapered portion 12 with a function of causing the air to stay. Therefore, the tapered portion 12 can make it difficult for the air 11 to flow into the flow path 2 without giving impact to the height of the liquid storage tank 4.

Figure 7:
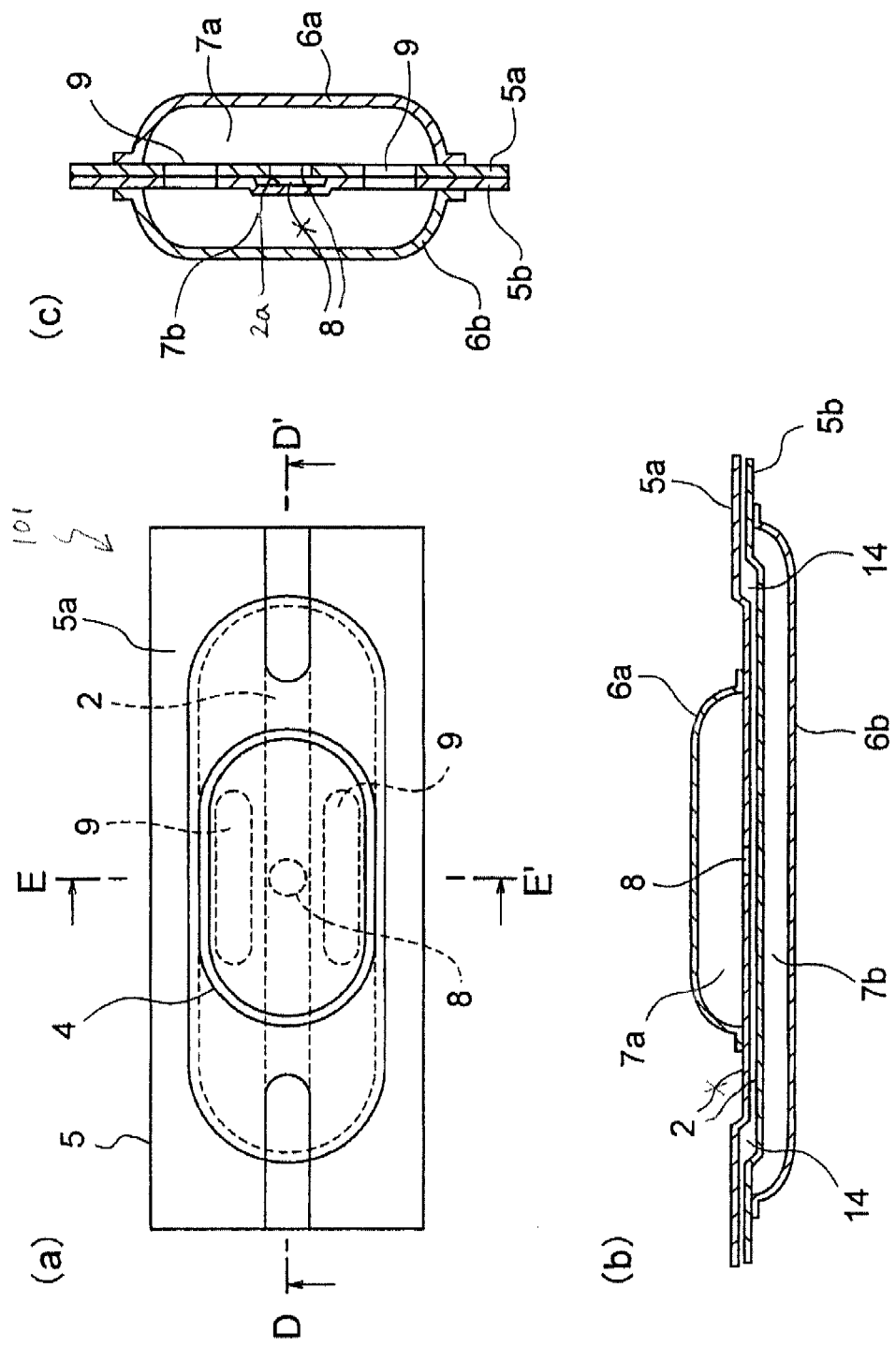
FIG. 7 shows a liquid storage tank of a cooling apparatus according to an embodiment 2 of this invention, wherein (a) is a top view, (b) is a sectional view taken along line D-D' in (a), and (c) is a sectional view taken along line E-E' in (a).

FIG. 7(a), FIG. 7(b), and FIG. 7(c) show a cooling apparatus according to an embodiment 2 of this invention, wherein FIG. 7(a) shows a top surface of the cooling apparatus, FIG. 7(b) shows a section taken along line D-D' in FIG. 7(a), and FIG. 7(c) shows a section taken along line E-E' in FIG. 7(a). In a description of the embodiment 2, the same portions as those described with reference to FIG. 2 of the embodiment 1 are assigned the same symbols to thereby omit explanation thereof and only different portions will be explained in the following description.

A cooling apparatus 101 of the embodiment 2 has a structure suitable for a case where a flow path 2 is formed to bulge by forming a heat conductive plate 5 by pressing or the like.

Referring to FIG. 7(a), FIG. 7(b), and FIG. 7(c), in the cooling apparatus 1, a groove 2a for forming the flow path 2 is formed by bulging at least one of a lower plate 5b and an upper plate 5a.

At a joining portion between a liquid storage tank upper cover 6a forming a liquid storage tank upper chamber (upper space) 7a above a branch hole 8 and the upper plate 5a, there is formed a flow path 2 bulging toward the lower plate 5b side. At a joining portion between a liquid storage tank lower cover 6b forming a liquid storage tank lower chamber (lower space) 7b below the branch hole 8 and the lower plate 5b, there is formed a bulged flow path 14 bulging toward the upper plate 5a side.

For example, in the case where a bulged flow path is formed by bulging the lower plate 5b of the heat conductive plate 5, if the liquid storage tank 4 like in the embodiment 1 is manufactured, it is necessary to join a bulged portion of the flow path 2 and the liquid storage tank lower cover 6b together, but since it is necessary to form the liquid storage tank lower cover 6b so as to precisely match the shape of the bulged portion of the bulged flow path 14, the working is difficult and thus the cost increases.

Therefore, at the joining portion between the liquid storage tank lower cover 6b and the lower plate 5b of the heat conductive plate 5, the flow path 2 is formed by bulging the upper plate 5a of the heat conductive plate 5. At the joining portion between the liquid storage tank upper cover 6a and the upper plate 5a of the heat conductive plate 5, the flow path 2 is formed by bulging the lower plate 5b of the heat conductive plate 5. With this configuration, the joining between the liquid storage tank upper cover 6a and the upper plate 5a of the heat conductive plate 5 and the joining between the liquid storage tank lower cover 6b and the lower plate 5b of the heat conductive plate 5 can be carried out on the flat surfaces, respectively, and thus the working is easy.

Further, if a bulged flow path 14 formed by bulging both the upper plate 5a of the heat conductive plate 5 and the lower plate 5b of the heat conductive plate 5 is provided in an arbitrary place inside the liquid storage tank 4, it is possible to maintain the circulability of the flow path 2.

Also in the embodiment 2, preferable conditions are that the volume of the liquid storage tank lower chamber 7b is greater than that of air 11 (see FIG. 3) and each bypass 9 is sufficiently larger than the branch hole 8. Further, the position and number of bypasses 9 and the handling of the tapered portion 12 described with reference to FIG. 6 are also as described in the embodiment 1.

FIG. 8(a), FIG. 8(b), and FIG. 8(c) show a modification of the embodiment 2. FIG. 8(a) to FIG. 8(c) correspond to FIG. 2 of the embodiment 1, wherein FIG. 8(a) shows a top surface, FIG. 8(b) shows an F-F' section, and FIG. 8(c) shows a G-G' section.

Referring to FIG. 8(a), FIG. 8(b), and FIG. 8(c), in a cooling apparatus 201, liquid storage tank lower covers 16a and 16b forming liquid storage tank lower chambers (lower spaces) 17a and 17b with respect to a branch hole 8 through bypasses 9, respectively, are formed so as not to cover a flow path.

In this modification, the liquid storage tank lower covers 16a and 16b are divided into two, i.e. the liquid storage tank lower cover 16a and the liquid storage tank lower cover 16b, and are spatially continuous with a liquid storage tank upper chamber 7a through the bypasses 9, respectively. By applying this structure, it is not necessary to join a bulged flow path 2 and the liquid storage tank lower covers 16a and 16b together and, as opposed to the embodiment 2, it is also not necessary to newly form a flow path 2 by bulging an upper plate 5a of a heat conductive plate 5.

Preferable conditions in this modification are that each bypass 9 is sufficiently larger than the branch hole 8 and the volume of each of the liquid storage tank lower chambers 17a and 17b formed by the liquid storage tank lower covers 16a and 16b is greater than that of air 11. Further, the position and number of bypasses 9 and the handling of the tapered portion 12 described with reference to FIG. 6 are also as described in the embodiment 1.

Figure 8:
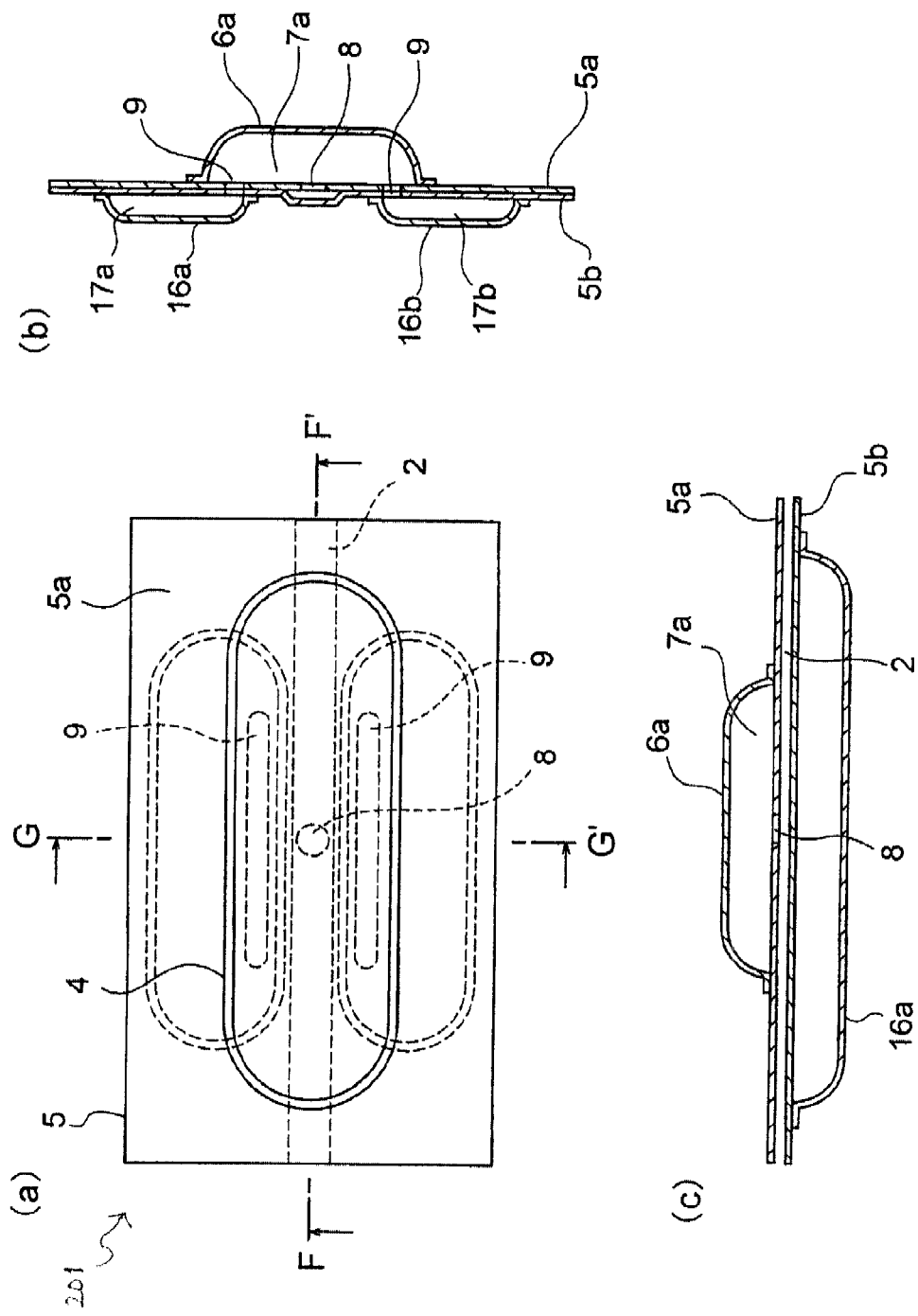
FIG. 8 shows a modification of the liquid storage tank of the embodiment 2 shown in FIG. 7, wherein (a) is a top view, (b) is a sectional view taken along line F-F' in (a), and (c) is a sectional view taken along line G-G' in (a).

The liquid storage tank lower covers 16a and 16b are divided into two in FIG. 8, but not limited to two, and may be divided into two or more. Even if a lower plate 5b shown in FIG. 8(c) is omitted, it is possible to form the liquid storage tank lower chamber 17a or 17b by joining the bulged flow path 2 and the liquid storage tank lower cover 16a or 16b to the lower plate 5b.

It is apparent that this invention is not limited to the foregoing embodiments and the respective embodiments can be properly changed within the scope of the technical thought of this invention.

The numbers, positions, shapes, or the like of the foregoing components are not limited to those in the foregoing embodiments and can be set to numbers, positions, shapes, or the like suitable for carrying out this invention.

According to an electronic device cooling apparatus of this invention, with the provision of a liquid storage tank having a bypass that allows a cooling medium to pass through an upper space and a lower space with respect to a branch hole, a lot of air can be reserved in the completely sealed electronic device cooling apparatus and, therefore, it is possible to provide the cooling apparatus having the liquid storage tank that is highly reliable and that can also use the lower side of a heat conductive plate.

Further, according to the electronic device cooling apparatus of this invention, with the provision of the bypass in the liquid storage tank, it is possible to use the lower side of the heat conductive plate and thus to increase the amount of air that can be reserved in the liquid storage tank, so that the height of the liquid storage tank can be lowered.

Further, according to the electronic device cooling apparatus of this invention, since the liquid storage tank is divided into the upper and lower portions with respect to the heat conductive plate, the entire cooling apparatus is well balanced and compact.

Further, according to the electronic device cooling apparatus of this invention, if the cooling apparatus is mounted so that the lower space of the liquid storage tank is disposed inside an electronic device in a place where other components are not provided, the lower side of the heat conductive plate gives no impact to the height of the electronic device, which is thus further preferable.

Further, according to the electronic device cooling apparatus of this invention, if a tapered portion of a circular truncated cone shape having an outlet of the branch hole as a vertex is formed in the upper space above the branch hole of the liquid storage tank, it is possible to make the air more difficult to return to a flow path. That is, with the tapered portion, the air moves along a tapered surface of the tapered portion when the liquid storage tank is rotated, and therefore, the air tends to jump over the neighborhood of the outlet of the branch hole.

Further, according to the electronic device cooling apparatus of this invention, since the air is caused to stay in the lower space through the bypass, it is not necessary to provide the tapered portion with a function of causing the air to stay. Therefore, the tapered portion can make it difficult for the air to flow into the flow path without giving impact to the height of the liquid storage tank.

The invention claimed is:

1. An electronic device cooling apparatus that diffuses heat generated from a heat generating component by circulation of a cooling medium to carry out cooling, said electronic device cooling apparatus comprising:
    a cooling device comprising a heat conductive plate formed with a flow path for the circulation of said cooling medium,
    a circulating pump for circulating said cooling medium, and
    a liquid storage tank for reserving in advance the cooling liquid in an amount corresponding to expected liquid permeation and air for suppressing the internal pressure,
    said heat conductive plate comprising a lower plate including a groove of a predetermined pattern according to the flow path, and an upper plate placing over the lower plate so as to face the groove,
    said storage tank comprising:
    a one liquid storage tank upper chamber provided on the upper side of the heat conductive plate,
    a one liquid storage tank lower chamber provided on the lower side of the heat conductive plate,
    a branch hole provided with the upper plate and branched from the flow path that connects the flow path and the liquid storage tank upper chamber, and
    a bypass provided with the heat conductive plate so as to allow said cooling medium to pass through the liquid storage tank upper chamber and the liquid storage tank lower chamber.

2. An electronic device cooling apparatus according to claim 1, wherein an area of said bypass is greater than that of an outlet of said branch hole.

* * * * *